(12) United States Patent
Beauvais et al.

(10) Patent No.: US 6,261,938 B1
(45) Date of Patent: *Jul. 17, 2001

(54) FABRICATION OF SUB-MICRON ETCH-RESISTANT METAL/SEMICONDUCTOR STRUCTURES USING RESISTLESS ELECTRON BEAM LITHOGRAPHY

(75) Inventors: Jacques Beauvais, Sherbrooke; Dominique Drouin, Deauville; Eric Lavallee, Sherbrooke, all of (CA)

(73) Assignee: Quantiscript, Inc., Sherbrooke (CA)

( * ) Notice: Subject to any disclaimer, the term of this patent is extended or adjusted under 35 U.S.C. 154(b) by 0 days.

This patent is subject to a terminal disclaimer.

(21) Appl. No.: 09/156,009

(22) Filed: Sep. 17, 1998

Related U.S. Application Data

(63) Continuation-in-part of application No. 08/821,651, filed on Mar. 20, 1997, now Pat. No. 5,918,143.

(30) Foreign Application Priority Data

Feb. 12, 1997 (CA) .................................. 2197400

(51) Int. Cl.$^7$ ..................................... H01L 21/44
(52) U.S. Cl. ......................... 438/607; 438/660; 438/682
(58) Field of Search .................................. 438/607, 660, 438/682

(56) References Cited

U.S. PATENT DOCUMENTS

| | | | |
|---|---|---|---|
| 4,093,503 | 6/1978 | Harris et al. | 156/628 |
| 4,214,966 | 7/1980 | Mahoney | 204/192 |
| 4,256,514 | 3/1981 | Pogge | 148/1.5 |

(List continued on next page.)

FOREIGN PATENT DOCUMENTS

| | | |
|---|---|---|
| 56-019045 | 2/1981 | (JP) . |
| 57-157249 | 9/1982 | (JP) . |

OTHER PUBLICATIONS

D. Drouin, J. Beauvais, R. Lemire, E. Lavallee, R. Gauvin and M. Caron, "Method for Fabricating Submicron Silicide Structures on Silicon Using a Resistless Electron Beam Lithography Process", Appl. Phys. Lett., 70 (22), Jun. 2, 1997; pp. 3020–3022.

S. Chou, P. Krauss, W. Zhang, L. Guo and L. Zhuang, "Sub–10 nm Imprint Lithography and Applications", J. Vac. Sci. Technol. B 15(6), Nov./Dec. 1997; pp. 2897–2094.

D. Wang, P.C. Hoyle, J.R.A. Cleaver, G.A. Porkolab and N.C. MacDonald, "Lithography Using Electron Beam Induced Etching of a Carbon Film," J. Vac. Sci. Technol. B 13(5), Sep./Oct. 1995, pp. 1984–1987.

(List continued on next page.)

Primary Examiner—Amir Zarablan
Assistant Examiner—Michael S. Lebentritt
(74) Attorney, Agent, or Firm—Quarles & Brady LLP

(57) ABSTRACT

A method for fabricating a sub-micron structure of etch-resistant metal/semiconductor compound on a substrate of semiconductor material comprises the step of depositing onto the substrate a layer of metal capable of reacting with the semiconductor material to form etch-resistant metal/semiconductor compound, and the step of producing a focused electron beam. The focused electron beam is applied to the layer of metal to locally heat the metal and semiconductor material and cause diffusion of the metal and semiconductor material in each other to form etch-resistant metal/semiconductor compound. The focused electron beam is displaced onto the layer of metal to form the structure of etch-resistant metal/semiconductor compound. Finally, the layer of metal is wet etched to leave on the substrate only the structure of metal/semiconductor compound. Following wet etching of the layer of metal, an oxygen plasma etch can be conducted to remove a carbon deposit formed at the surface of the structure of etch-resistant metal/semiconductor compound. Also, the substrate may be subsequently etched to remove a thin layer of metal rich semiconductor material formed at the surface of the substrate by reaction, at room temperature, of the metal and semiconductor material with each other.

38 Claims, 5 Drawing Sheets

U.S. PATENT DOCUMENTS

| | | | |
|---|---|---|---|
| 4,402,128 | | 9/1983 | Blackstone ............................. 29/591 |
| 4,496,419 | | 1/1985 | Nulman et al. ....................... 156/643 |
| 4,530,891 | | 7/1985 | Nagaerkawa et al. .................. 430/5 |
| 4,569,124 | | 2/1986 | Rensch et al. ......................... 29/591 |
| 4,772,539 | | 9/1988 | Gillespie .............................. 430/296 |
| 4,804,438 | | 2/1989 | Rhodes ................................ 156/653 |
| 4,924,294 | * | 5/1990 | Tanielian .............................. 357/71 |
| 4,931,353 | * | 6/1990 | Tanielian ............................. 437/200 |
| 4,997,809 | | 3/1991 | Gupta ..................................... 505/1 |
| 5,075,243 | | 12/1991 | Nieh et al. ............................ 437/40 |
| 5,248,633 | * | 9/1993 | Morar et al. ......................... 437/196 |
| 5,315,130 | | 5/1994 | Hively et al. .......................... 257/48 |
| 5,444,007 | | 8/1995 | Tsuchiaki .............................. 437/35 |
| 5,478,698 | | 12/1995 | Rostoker et al. .................... 430/296 |
| 5,772,905 | | 6/1998 | Chou ..................................... 216/44 |
| 5,918,143 | * | 6/1999 | Beauvis et al. ...................... 438/607 |
| 5,976,392 | * | 11/1999 | Chen .................................... 427/261 |

OTHER PUBLICATIONS

Hiroyuki Sugimura and Nobuyuki Nakagiri, "Scanning Probe Anodization: Patterning of Hydrogen–Terminated Silicon Surfaces for the Nanofabrication of Gold Structures by Electroless Plating," J. Vac. Sci.Technol. B 13(5), Sep./Oct. 1995, pp. 1933–1937.

C.A. Dimitriadis, "Effect of Conventional and Rapid Thermal Annealing on Platinum Silicide Schottky Barrier Diodes," Appl. Phys. Lett. 56(2), Jan. 8, 1990, pp. 143–145.

R. Pretorius, M.A.E. Wandt, J.E. McLeod, A.P. Botha and C.M. Comrie, "Determination of the Diffusing Species and Diffusion Mechanism During CoSi, NiSi, and PtSi Formation by Using Radioactive Silicon as a Tracer," J. Electrochem. Soc., vol. 136, No. 3, Mar. 1989, pp. 839–842.

Bing–Yue Tsui and Mao–Chieh Chen, "Low–Temperature Reaction of Thin–Film Platinum (≤300 Å) with (100) Silicon," J. Appl. Phys. 68(12), Dec. 15, 1990, pp. 6246–6252.

C.A. Crider and J.M. Poate, "Growth Rates for $Pt_2Si$ and PtSi Formation Under UHV and Controlled Impurity Atmospheres," Appl. Phys. Lett. 36(6), Mar. 15, 1980, pp. 417–419.

Chin–An Chang and W.–K. Chu, "Ambient Effects on the Diffusion of Cr and Si in Thin Pt Films," Appl. Phys. Lett. 37(2), Jul. 15, 1980, pp. 161–162.

S.P. Beaumont, P.G. Bower, T. Tamamura and C.D.W. Wilkinson, "Sub–20–nm–Wide Metal Lines by Electron–Beam Exposure of Thin Poly(methylmethacrylate) Films and Liftoff," Appl. Phys. Lett. 38(6), Mar. 15, 1981, pp. 436–439.

Wei Chen and Haroon Ahmed, "Fabrication of Sub–10 nm Structures by Lift–off and by Etching After Electron–Beam Exposure of Poly(methylmethacrylate) Resist on Solid Substrates," J. Vac. Sci Technol. B 11(6), Nov./Dec. 1993, pp. 2519–2523.

M. Yasuda, H. Kawata, K. Murata, K. Hashimoto, Y. Hirai and N. Nomura, "Resist Heating Effect in Electron Beam Lithography," J. Vac. Sci. Technol. B 12(3), May./Jun. 1994, pp. 1362–1366.

L. Ley, Y. Wang, V. Nguyen Van, S. Fisson, D. Souche, G. Vuye and J. Rivory, "Initial Stages in the Formation of PtSi on Si(111) as Followed by Photemission and Spectroscopic Ellipsometry," Thin Solid Films, 270 (1995), pp. 561–566.

E. D'Anna, G. Leggieri, A. Luches and G. Majni, "Dynamics of the Si–Pt Reaction Under Pulsed Heat Flow," Thin Solid Films, 129 (1985) pp. 93–102.

Chin–An Chang, "PtSi Contact Metallurgy: Effect of Silicide Formation Process," J. Appl. Phys. 58(8), Oct. 15, 1985, pp. 3258–3261.

Chin–An Chang and Armin Segmüller, "PtSi Contact Metallurgy Formed by Three–Temperature Annealing Sequences and Short Annealing Time," J. Appl. Phys. 61(1), Jan. 1, 1987, pp. 201–205.

A. Torres, S. Kolodinski, R.A. Donaton, K. Maex, P. Roussel and H. Bender, "New Process for the Controlled Formation of Ultra–Thin PtSi Films for Infrared Detector Applications," SPIE Vol. 2554, pp. 185–190.

J. Fujita, H. Watanabe, Y. Ochiai, S. Manako, J.S. Tsai and S. Matsui, "Sub–10 nm Lithography and Development Properties of Inorganic Resist by Scanning Electron Beam," Appl. Phys. Lett. 66(22), May 29, 1995, pp. 3065–3067.

E.G. Colgan, "Activation Energy for $Pt_2Si$ and PtSi Formation Measured Over a Wide Range of Ramp Rates," J. Mater. Res., vol. 10, No. 8, Aug. 1995, pp. 1953–1957.

B. Singh et al., "Sub–50–nm Lithography in Amorphous Se–Ge Inorganic Resist by Electron Beam Exposure", pp. 1002–1004, Nov. 15, 1982.

M. Colburn et al., "Step and Flash Imprint Lithography: A New Approach to High–Resolution Patterning", pp. 379–389, Mar. 1999.

* cited by examiner

US 6,261,938 B1

FABRICATION OF SUB-MICRON ETCH-RESISTANT METAL/SEMICONDUCTOR STRUCTURES USING RESISTLESS ELECTRON BEAM LITHOGRAPHY

This application is a continuation in part of Ser. No. 08/821,651, filed Mar. 20 1997, which is now U.S. Pat. No. 5,918,143.

BACKGROUND OF THE INVENTION

1. Field of the Invention

The present invention relates to a method for fabricating a structure of etch-resistant metal/semiconductor compound using resistless electron beam lithography, more specifically a highly focused electron beam to produce a sub-micron structure of etch-resistant metal/semiconductor compound.

2. Brief Description of the Prior Art

The fabrication of ultra-small scale electronic devices requires efficient high resolution lithography techniques. Resist-based lithography processes are very frequently involved in these high resolution lithography techniques, and poly(methyl methacrylate) (PMMA) is the polymer most widely used as a resist for electron beam lithography applications (S. P. Beaumont, P. G. Bower, T. Tamamura, C. D. W. Wilkinson, *Appl. Phys. Lett.*, 38, 438 (1991) and W. Chen, H. Ohmed, *J. Vac. Sci. Technol.*, B 11, 2519 (1993)).

These types of lithographic processes suffer from several limitations which can become extremely constraining in the fabrication of sub-100 nm devices. These limitations include undesirable proximity effects in the resist and resolution limits imposed by the size of the polymer molecules. Proximity effects are produced when the exposed patterns are situated within the range of backscattered electrons. These electrons are primary electrons which collide with the substrate with a great angle to escape from the surface with a high energy in an area which may be considerably larger than the electron beam diameter. These high energy electrons expose the resist in an undesirable region. Current research efforts in lithography techniques include several resistless processes for defining patterns (see for example D. Wang, P. C. Hoyle, J. R. A. Cleaver, G. A. Porkolab, N. C. MacDonald, *J. Vac. Sci. Technol.*, B 13, 1984 (1995) for electron beams; and H. Sugimura and N. Nakagiri, *J. Vac. Sci. Technol.*, B 13, 1933 (1995) for a scanning probe technique).

The formation of a silicide layer is usually carried out by annealing samples of thin metal layers on silicon substrates in a conventional furnace with a controlled atmosphere of $N_2$-$H_2$. This annealing technique requires several minutes to convert the metal film into silicide (see C. A. Chang, *J. Appl. Phys.*, 58, 3258 (1985); C. A. Chang and A. Segmuller, *J. Appl. Phys.*, 61, 201 (1987); C. A Chang and W. K. Chu, *Appl. Phys. Lett.*, 37, 3258 (1980); and C. A. Chang and J. M. Poate, *Appl. Phys. Let.*, 36, 417 (1980)).

New techniques involving Rapid Thermal Annealing (RTA) improve the process of the formation of silicide. RTA silicide films are significantly better than those formed by conventional annealing (C. A Dimitriadis, *Appl. Phys. Lett.*, 56, 143 (1990)), due to a shorter processing time (A. Torres, S. Kolodinski, R. A. Donaton, K. Roussel and H. Bender, *SPIE*, 2554, 185 (1995)).

More recently, several techniques of formation of silicide have been developed. These processes involve heating of metal-silicon interfaces using photons, electrons and ion beams (J. M. Poate and J. W. Mayer, *Laser Annealing of Semiconductor*, Academic Press, New York, 1982; J. Narayan, W. L. Brown and R. A. Lemons, *Laser-Solids Interactions and Transient Processing of Materials*, North-Holland, N.Y., 1983; and E. D'Anna, G. Leggieri and A. Luches, *Thin Solids Films*, 129, 93 (1985)). All these processes are based on the concept of forming silicide with localized heating near the surface. However, none of these techniques are intended as lithography processes or for the fabrication of masks for lithography.

Ultra-violet (UV) lithography is the technique used in large scale production of devices and circuits. However, the wavelength of ultra-violet light represents a physical limit to the resolution that can be achieved using this technique. Alternative techniques are being evaluated to replace UV lithography for industrial production of electronic devices and circuits. One of these techniques is X-ray lithography, since X-rays have a much smaller wavelength than UV. In this technique, regions of a mask placed between the X-ray source and the sample are covered by a layer of heavy atoms (such as Ta, W and tantalum suicides) which absorbs X-rays (J. Canning, *Journal of Vacuum Science and Technology*, B15, 2109 (1997)). Such masks are fabricated using electron-beam lithography. A major challenge in the fabrication of these masks is to use electron-beam lithography to form structures (etch masks) that have both a high resolution and an excellent resistance to chemicals employed to remove the absorbent layer of heavy atoms in unprotected regions. Conventional techniques using polymeric resists as etch masks either do not provide a sufficient resolution or do not provide a sufficient resistance to chemical etching (J. P. Silverman, *Journal of Vacuum Science and Technology*, B15, 2117 (1997)).

OBJECTS OF THE INVENTION

An object of the present invention is therefore to overcome the above described drawbacks of the prior art.

Another object of the invention is to provide a method involving a direct write resistless lithography technique to produce a structure of etch-resistant metal/semiconductor compound on a substrate of semiconductor material with achievable linewidths below 50 nm.

A further object of the invention is to provide a direct write resistless lithography method capable of fabricating masks for X-ray lithography.

A still further object of the invention is to provide a direct write resistless lithography method for fabricating molds usable for nanoimprint lithography.

SUMMARY OF THE INVENTION

Generally, the present invention relates to a method for fabricating a structure of etch-resistant metal/semiconductor compound on a substrate of semiconductor material, comprising the steps of depositing onto the substrate a layer of metal capable of reacting with the semiconductor material to form etch-resistant metal/semiconductor compound, producing a focused electron beam, applying the focused electron beam to the layer of metal to locally heat the metal and semiconductor material and cause diffusion of the metal and semiconductor material in each other to form etch-resistant metal/semiconductor compound, displacing the focused electron beam onto the layer of metal to form the structure of etch-resistant metal/semiconductor compound, and wet etching the layer of metal to leave on the substrate of semiconductor material only the structure of etch-resistant metal/semiconductor compound.

The use of a focused electron beam in a resistless lithography method enables the production of a structure of etch-resistant metal/semiconductor compound having linewidths as thin as 50 nm.

The semiconductor material may be selected from the group consisting of silicon and gallium arsenide, and the metal may be selected from the group consisting of cobalt, chrome, hafnium, iridium, manganese, nickel, palladium, platinum, rhodium, tantalum, titanium, tungsten, zirconium.

Preferably, each portion of the structure of etch-resistant metal/semiconductor compound is exposed to the focused electron beam a plurality of times to achieve finer linewidths.

In accordance with a preferred embodiment of the present invention, the etch-resistant metal/semiconductor compound is formed by silicide and the substrate of semiconductor material is a silicon substrate.

Following the step of wet etching the layer of metal, an oxygen plasma etch can be conducted to remove a carbon deposit formed at the surface of the silicide structure. After the step of wet etching the layer of metal, the silicon substrate may also be wet etched to remove a thin layer of metal rich silicon formed at the surface of the silicon substrate by reaction, at room temperature, of the metal and silicon with each other.

The present invention also relates to a method for fabricating a structure of etch-resistant metal/semiconductor compound on a substrate, comprising the steps of depositing onto the substrate a layer of semiconductor material, depositing onto the layer of semiconductor material a layer of metal capable of reacting with the semiconductor material to form etch-resistant metal/semiconductor compound, producing a focused electron beam, applying the focused electron beam to the layer of metal to locally heat the metal and semiconductor material and cause diffusion of the metal and semiconductor material in each other to form etch-resistant metal/semiconductor compound, displacing the focused electron beam onto the layer of metal to form the structure of etch-resistant metal/semiconductor compound, wet etching the layer of metal to leave on the layer of semiconductor material only the structure of etch-resistant metal/semiconductor compound, and plasma etching the layer of semiconductor material to leave on the substrate only the structure of etch-resistant metal/semiconductor compound.

Preferably the semiconductor material is selected from the group consisting of silicon and gallium arsenide, and the metal is selected from the group consisting of cobalt, chrome, hafnium, iridium, manganese, nickel, palladium, platinum, rhodium, tantalum, titanium, tungsten, zirconium.

Advantageously, the substrate is composed of at least one layer of deposited material selected from the group consisting of: clean silicon, silicon carbide, tantalum, titanium, tungsten, glass, quartz and another material capable of resisting to etching.

The present invention further relates to a method for fabricating a structure of etch-resistant metal/semiconductor compound on a substrate, comprising the steps of depositing onto the substrate a layer of metal, depositing onto the layer of metal a layer of semiconductor material capable of reacting with the metal to form etch-resistant metal/semiconductor compound, producing a focused electron beam, applying the focused electron beam to the layer of semiconductor material to locally heat the semiconductor material and the metal and cause diffusion of the metal and semiconductor material in each other to form etch-resistant metal/semiconductor compound, displacing the focused electron beam onto the layer of semiconductor material to form the structure of etch-resistant metal/semiconductor compound, plasma etching the semiconductor material to leave on the layer of metal only the structure of etch-resistant metal/semiconductor compound, and wet etching the layer of metal to leave on the substrate only the structure of etch-resistant metal/semiconductor compound.

The objects, advantages and other features of the present invention will become more apparent upon reading of the following non restrictive description of preferred embodiments thereof, given by way of example only with reference to the accompanying drawings.

DETAILED DESCRIPTION OF THE PREFERRED EMBODIMENTS

Figure 1A:
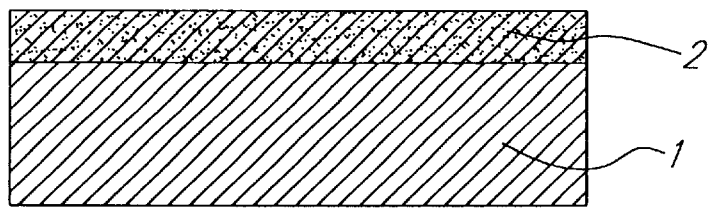
FIG. 1a is a side elevational view of a silicon substrate on which a layer or film of metal has been deposited.

The present invention is therefore directed toward a direct write lithography technique for producing structures of etch-resistant metal/semiconductor compound on various substrate materials, with achievable linewidths below 50 nm. The obtained etch-resistant metal/semiconductor compounds are extremely resistant to halo-carbide and Freon plasma etching, making them excellent etch masks. This technique is intended to be used as lithography process or for fabricating X-ray lithography masks.

The present invention can also be used as a method for fabricating molds for nanoimprint lithography (see S. Y. Chou, P. R. Krauss et al., *Journal of Vacuum Science and Technology,* B15, 2897 and S. Y. Chou, U.S. Pat. No. 5,772,905, June 1998). The fabrication of molds for this lithography technique requires an etch mask with both high resolution and excellent resistance to chemicals used for etching the mold material. For example, suicides formed by localized heating of metal and silicon layers by an electron-beam lithography system provide such an etch mask.

In the different figures of the appended drawings, the corresponding elements are identified by the same reference numerals.

Appended FIGS. 1*a,* 1*b,* 1*c* and 1*d* illustrate various steps of a preferred embodiment of the method according to the present invention, for fabricating a structure 3 of suicide on a silicon substrate 1. This method uses a controlled and focused electron beam 4 (FIG. 1*b*) to anneal the silicon substrate 1 and a layer or film of metal 2 deposited on the substrate 1.

Figure 1B:
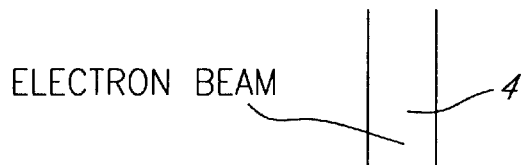
FIG. 1b is a side elevational view of the silicon substrate and layer of metal of FIG. 1a, showing annealing of the silicon substrate and layer of metal by means of a controlled and focused electron beam.
Figure 1B:
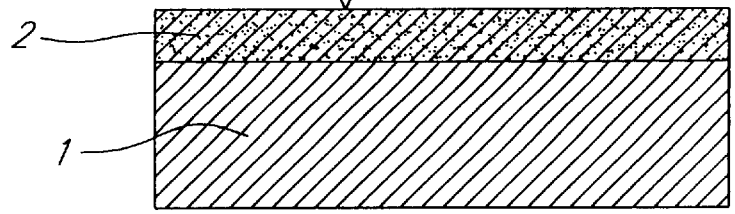
Figure 1C:
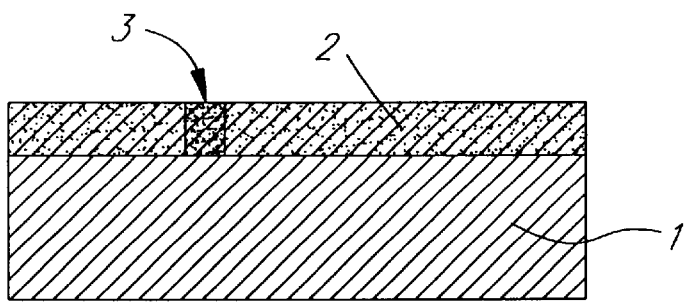
FIG. 1c is a side elevational view of the silicon substrate and layer of metal of FIG. 1a, showing a silicide structure that has been formed on the silicon substrate.
Figure 1D:
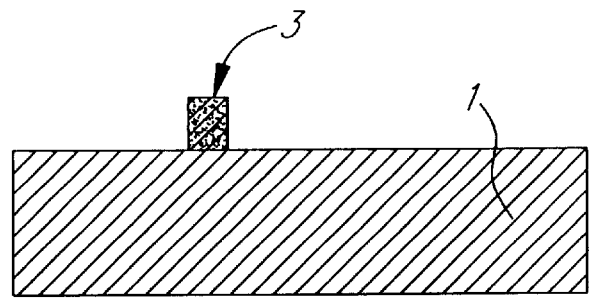
FIG. 1d is a side elevational view of the silicon substrate and layer of metal of FIG. 1a, in which the non reacted portion of the layer of metal has been wet etched to leave on the silicon substrate only the silicide structure.

More specifically, one of the preferred embodiments of the method according to the invention, for fabricating a silicide structure 3, formed for example of ultra-narrow lines of conductive silicide, onto the silicon substrate 1 can be summarized as follows:

FIG. 1*a:* a layer of metal 2 capable of reacting with silicon to form silicide is deposited on the previously cleaned silicon substrate 1 using for example an electron beam evaporation technique or cool sputtering in a low vacuum chamber (see FIG. 1*a*);

FIG. 1*b:* the layer of metal 2 and the silicon substrate 1 are annealed by applying the focused electron beam 4 to the layer of metal 2 to locally heat the metal and silicon and cause diffusion of the metal and silicon in each other to form silicide. It has been demonstrated (M. Yasuda, H. Kawata, K. Murata, K. Hashimoto, Y. Hirai and N. Nomura, *J. Cac. Sci. Technol.,* B12, 1362 (1994)) that temperatures greater than 400° C. can be obtained with a focused electron beam, such as the one produced in a Scanning Electron Microscope (SEM). The temperature required to form silicide of several metals varies from 200–700° C. (S. M. Sze. Physics of Semiconductor Devices $2^{nd}$ Edition, Wiley, N.Y. (1990)). The electron beam is controlled, for example computer-controlled, to produce current density higher than 100 mA/cm$^2$ so as to increase locally the temperature to a few hundred degrees Celsius. The electron beam is also displaced, for example under the control of a computer, to expose a desired pattern to be given to the silicide structure (see FIG. 1*b*);

FIG. 1*c:* the area exposed to the focused electron beam has been transformed into a silicide structure 3 due to the above mentioned diffusion of the metal and silicon in each other; and FIG. 1*d:* the sample of FIG. 1*c* is immersed into an acid solution that is able to etch the metal film 2 but not the silicide structure 3. Usually, an aqua regia solution ($H_2O$:HCl:$HNO_3$=8:7:1) is a proper acid to perform this task. After this wet etch, only the area (silicide structure) having been exposed to the electron beam will remain on the substrate.

Exposure to the electron beam 4 may deposit some carbon at the surface of the silicide structure 3, which carbon may be removed through an oxygen plasma etch. During the evaporation process, the metal of the layer 2 may react at room temperature with the silicon of the substrate 1 to form a thin layer (not shown) of metal rich silicon. This undesirable layer can be removed by a wet etching of the silicon. A standard chemical etch such as $H_2O$:$HNO_3$:HF=50:49:1 can be used for that purpose.

Figure 3A:
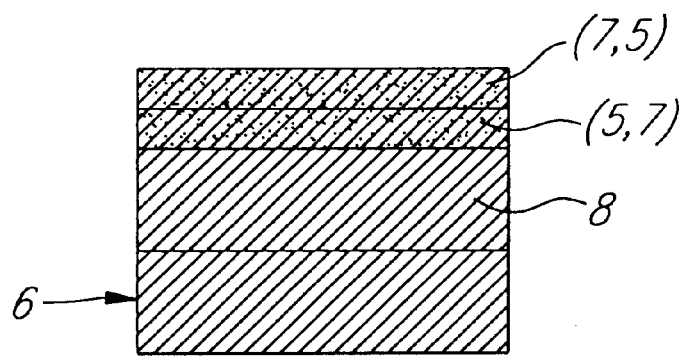
FIG. 3a is a side elevational view showing a substrate, a deposited layer of substrate capable of absorbing X-rays, a deposited silicon layer and a deposited metal layer.

Another preferred embodiment of the method according to the invention may be summarized as follow:

FIGS. 3*a,* 3*b*, 3*c,* 3*d,* 3*e* and 3*f* illustrate a method for fabricating ultra small structures of a silicide and how to use these silicide structures as an etch mask. The technique uses a computer-controlled focused electron beam to pattern the silicide structures on the surface of the substrate. This method comprises the following steps:

FIG. 3*a:* A layer of silicon 5 is deposited on the substrate 6, and a layer of metal 7 is then deposited on the layer of silicon 5. Deposition of the layers 5 and 7 is performed by either an electron beam evaporation technique, a thermal evaporation technique or by cool sputtering in a low vacuum chamber. Alternatively, the method can also be done by inverting the order of deposition of the silicon and metal layers 5 and 7; more specifically, the layer of metal 7 is first deposited on the substrate 6 and, then, the layer of silicon is deposited on the metal layer 7. This technique can be used on substrates of clean silicon, silicon carbide, glass, quartz, tantalum, titanium, tungsten and any other substrate which resists the chemical etching of the top metal layer 7. The substrate 6 may comprise a deposited layer 8 or several deposited layers such as 8 of any of the above materials on the substrate 6 which can then be made of any material.

Figure 3B:
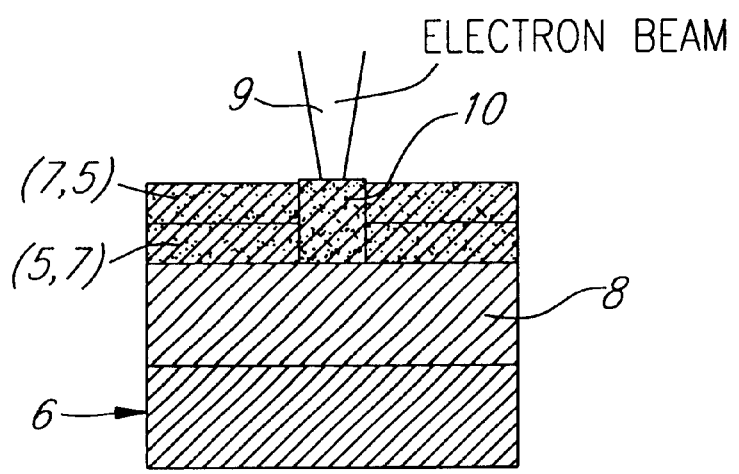
FIG. 3b is a side elevational view of the substrate, deposited layer of substrate capable of absorbing X-rays, deposited silicon layer and deposited metal layer of FIG. 3a showing silicide formed by reaction between the silicon layer and the metal layer after an annealing treatment using a focused electron beam.

FIG. 3*b:* The metal and silicon layers 5 and 7 are annealed using a focused electron beam 9. It has been shown that temperatures greater than 400° C. can be obtained with a focused electron beam, such as one found in a scanning electron microscope (SEM) [Yasuda, M., Kawata, H., Murata, K., Hashimoto. K., Hirai, Y., Nomura, N., Journal of Vacuum Science and Technology, B12, 1362, (1994)]. The temperature to form the suicide of several metals varies from 200–700° C. [Sze, S. M., Physics of Semiconductor Devices, $2^{nd}$ edition, Wiley, N.Y., (1990)]. In this method, the current density must be sufficiently high to reach the energy necessary to form the silicide. Silicide 10 is formed over the substrate 6 in the regions exposed to the electron beam 10 [Drouin, D., Beauvais, J., Lemire, R., Lavallée, E., Gauvin, R., Caron, M., Applied Physic Letters, 70, 3020, (1997)]. The electron beam is controlled by a computer to form patterned structures of silicide 10.

Figure 3C:
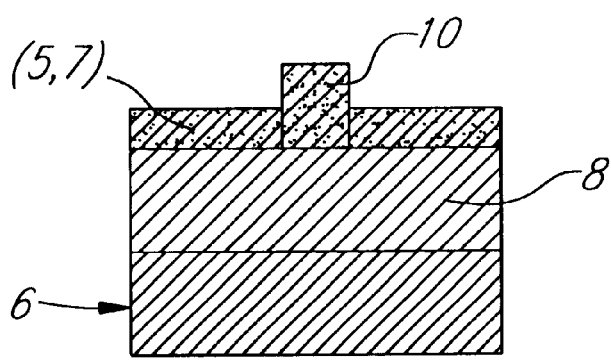
FIG. 3c is a side elevational view corresponding to the side elevational view of FIG. 3b, in which the metal layer has been etched.

FIG. 3*c:* (a) The sample is immersed in an acid solution that is able to etch the top metal film 7, leaving the silicide structure 10 intact. Usually, an aqua regia solution ($H_2O$:HCL:HNCl) is a proper acid to perform this task.

(b) Alternatively, a halo-carbide plasma is used to etch, i.e. remove the top silicon layer 5, leaving the silicide structure 10 intact.

Figure 3D:
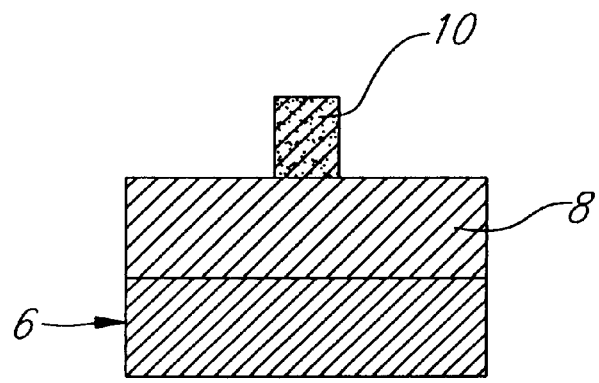
FIG. 3d is a side elevational view corresponding to the side elevational view of FIG. 3c, in which the silicon layer has been etched.

FIG. 3*d:* (a) An halocarbide plasma is used to etch and remove the silicon layer 5.

(b) Alternatively, the sample is immersed in an acid solution that is able to etch the metal film 7, leaving the silicide structure 10 intact. Usually, an aqua regia solution ($H_2O:HCL:HNO_3$) is a proper acid to perform this task.

After this etching operation, only the silicide structure 10 formed by the electron beam 9 remain over the substrate 6 or deposited layer 8.

Figure 3E:
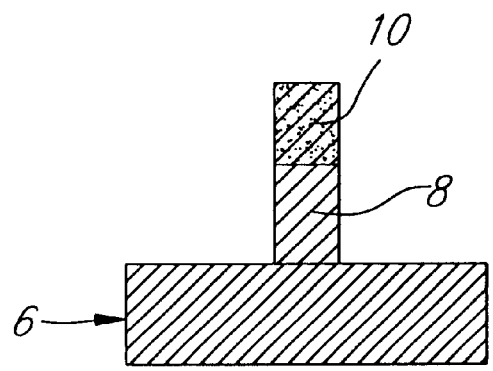
FIG. 3e is a side elevational view corresponding to the side elevational view of FIG. 3d, in which the deposited layer of substrate capable of absorbing X-rays has been etched.
Figure 3F:
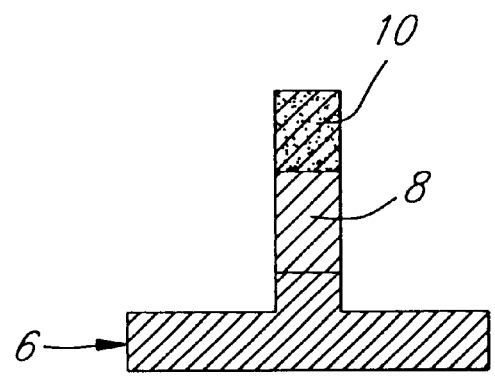
FIG. 3f is a side elevational view corresponding to the side elevational view of FIG. 3d, in which the deposited layer of substrate capable of absorbing X-rays has been etched, and in which the substrate has been partially etched.

FIGS. 3e–f Etching of the remaining layer(s) 8 and eventually a portion of the substrate 6 under the layer(s) 8 is performed using either a directional plasma, a non-directional plasma or a wet etch. In any case, the silicide 10 acts as an etch mask, i.e. areas underneath the suicide structure 10 are not etched. In the case of wet etching and non-directional plasma etching however, a certain undercut may occur under the suicide structure 10 due to the non-directionality of the etch.

The electron beam 9 may deposit some carbon at the surface of the silicide 10, this carbon may be removed by an oxygen plasma etch.

EXAMPLE 1

In this example, the method in accordance with the present invention will be applied to the production of a platinum silicide.

The activation energy to first form $Pt_2Si$ is around 1.4 eV and the temperature range is situated between 200–350° C. The growth of PtSi takes place only when all the Pt is transformed into $Pt_2Si$, the activation energy in this case is increased to 1.6 eV and the range of temperature formation is 300–450° C. (E. G. Colgan, *J. Mater Res.,* 10, 1953 (1995)). Thus it is possible to form patterned platinum silicide structures, that is carrying out the method of the invention using a standard SEM system.

Platinum layers of several thicknesses (20 nm to 100 nm) were evaporated onto clean n-type high resistivity silicon <100> substrates using an electron gun deposition system with an evaporation rate of 0.5 nm/s. To carry out the present invention into practice, a electron beam lithography system consisting of a JEOL JSM-6300 Scanning Electron Microscope (SEM) equipped with a tungsten filament and a beam blanker and controlled with the NPGS (Nanometer Pattern Generation System ver. 7.5, by J. C. Nabity Lithography Systems) lithography software. A SEM produces a highly focused electron beam suitable to produce sub-micron silicide structures. Exposures were carried out at several low energies (1 keV to 5 keV) and the unexposed platinum was removed from the silicon surface using an aqua regia solution of $H_2O:HCl:HNO_3=8:7:1$. An etch time of 4 minutes at 80° C. was used. The difference in etch rates for the unexposed Pt and the silicide was sufficient to obtain a selective etch. However, prolonged etching can remove the silicide structure.

Figure 2A:
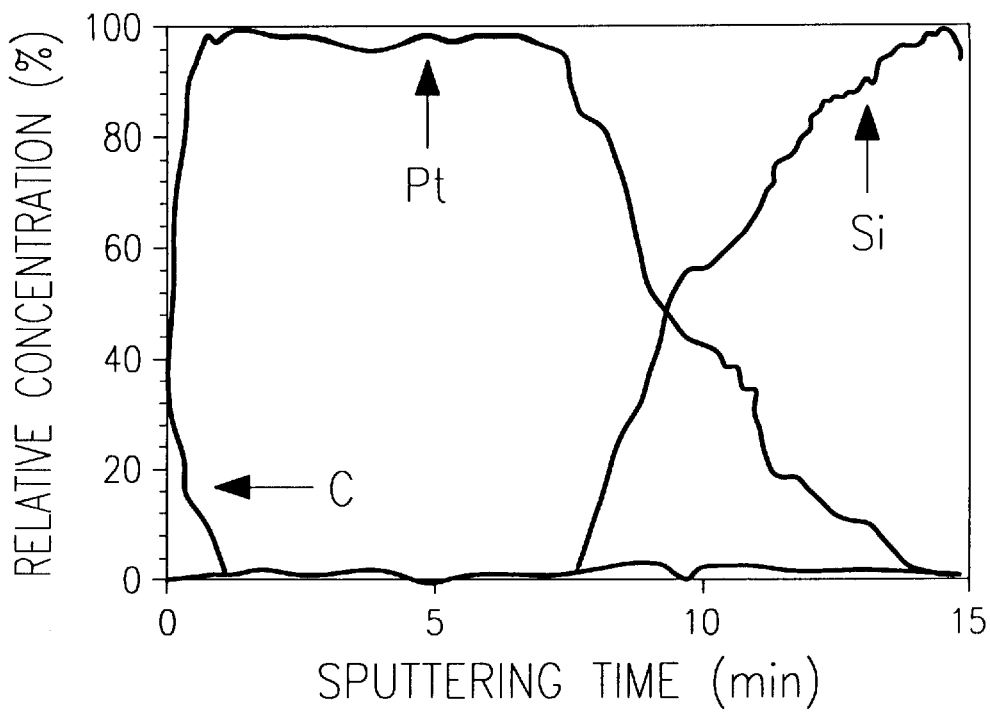
FIG. 2a is a graph showing an Auger Electron Spectroscopy (AES) depth profile of a layer or film of platinum (Pt) deposited onto a silicon substrate.
Figure 2B:
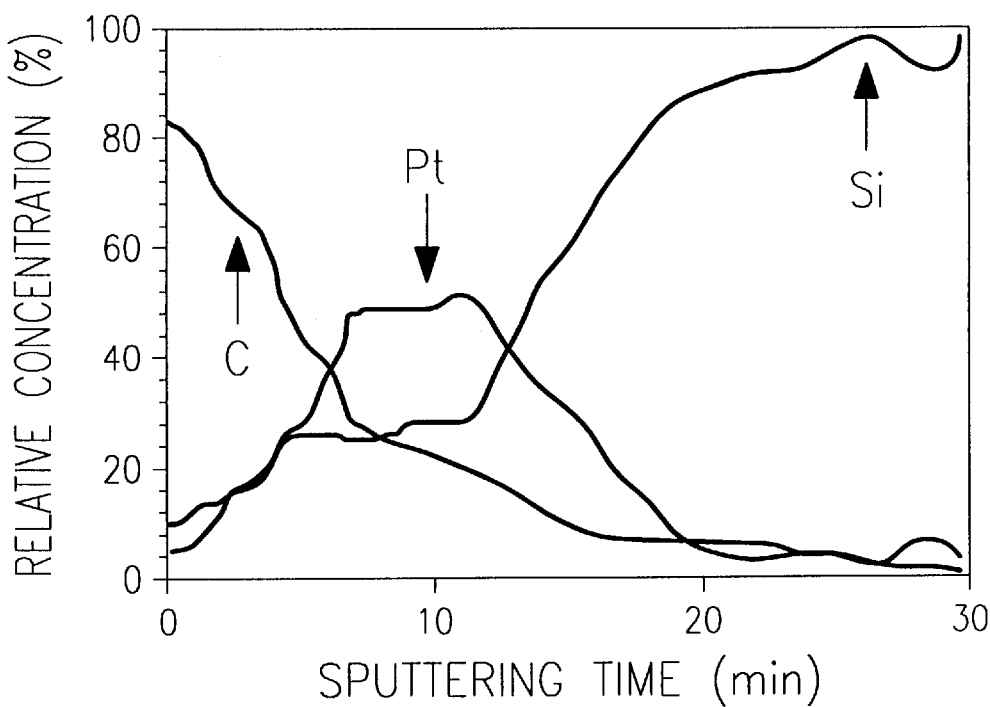
FIG. 2b is a graph showing an AES depth profile of a layer or film of platinum (Pt) deposited onto a silicon substrate, after an annealing treatment using an electron beam.

FIG. 2a shows an Auger Electron Spectroscopy (AES) depth profile of a 50 nm Pt thin film as deposited. As expected a smooth transition from the deposited layer to the substrate can be observed. In FIG. 2b, the analysed sample consists of a 20 $\mu$m×20 $\mu$m structure exposed with the electron beam. The line dose used to produce the square was 17 $\mu$C/cm. The surface of the platinum silicide is contaminated with carbon which originates from the SEM chamber. A plateau can be observed corresponding to a $Pt_2Si$ region. From this spectrum it is clear that the heating effect of the focused electron beam is sufficient to enable the diffusion of silicon through the metal layer (R. Pretaurius, M. A. E. Wandt and J. F McLoed, *J. Electrochem. Soc.,* 136, 839 (1989)) and form platinum silicide which has a smaller etch rate than pure Pt. This difference in etch rates provides a means to pattern the metal layer with sub-micron resolution.

The formation of the silicide depends on several factors. The thickness of the deposited layer determines the values of the accelerating voltage of the electron beam. Better results have been observed when the maximum dissipated energy of the electrons occurs in the metal layer near the junction with silicon. Another important factor that determines the temperature rise is the current density. Experiments have been carried out with a tungsten filament and the current density is approximately 100 mA/cm² for a 1 keV electron beam (J. I. Goldstein, D. E. Newbury, P. Echlin, D. C. Joy, A. D. Romig Jr., C. E. Lyman, C. Fiori, E. Lifshin, *Scanning Electron Microscopy and X-Ray Microanalysis,* Second Edition, Plenum Press, New York, 1994, pp 820). This value decreases slightly for currents lower that 100 pA. Also, the current density increases with the electron beam energy, due to the smaller probe size. The higher the current density the higher is the heat obtained at the interface Pt-Si. The last parameter that determines the formation of the suicide is the electron beam exposure time or the line dose. A threshold line dose is required to form the silicide; when the exposed time is lower than the threshold value, the pattern will not resist the wet etching.

EXAMPLE 2

As an example to form fine structures using 20 nm of Pt evaporated on a silicon substrate, a 3 keV electron beam would be adequate. In fact linewidths less than 50 nm have been obtained using a 100 pA electron beam (≈200 mA/cm²), 1.5 $\mu$C/cm dose. In this case, to reduce the carbon contamination and the local charging effects, the complete dose was achieved by multiple exposition (J. Fujita, H. Watanabe, Y. Ochiai, S. Manako, J. S. Tsai and S. Matsui, *Appl. Phys. Lett.,* 66, 3065 (1995)). More specifically, each segment of the microstructure has been exposed 20 times using a reduced line dose of 0.075 $\mu$C/cm. The effect of carbon contamination is to absorb some of the electron energy, thus reducing the amount of energy lost in the metal layer and decreasing the temperature rise. This technique of multiple exposition reduces the total line dose required for threshold, by reducing the rate of carbon deposition. Multiple repetition also significantly decreases the linewidth at threshold. For a given line dose, multiple repetition implies a series of shorter exposure times for the pattern. In this case, the temperature required for silicide formation may only be attained in the center of the beam due to its Gaussian profile, thus creating the silicide in a region which is narrower than the beam diameter.

After the wet etch, the unexposed area may be contaminated with Pt. In fact, the first few nanometers of Pt evaporated can react with silicon at room temperature to form a suicide of about 2 nm in thickness (L. Ley, Y. Wang, V. Nhuyen Van, S. Fisson, D. Soche, G. Vuye and J. Rivory, *Thin solids film,* 270, 561 (1995)), thereby decreasing the surface resistivity of the silicon. The surface resistivity was restored to its original value by using a second wet etch conducted during 6 minutes in $H_2O:HNO_3:HF=50:49:1$. Also, to remove the surface carbon contamination due to prolonged beam exposure in the SEM chamber, the surface of the silicide structure can be exposed to an oxygen plasma etch for 20 minutes.

Proximity effects are reduced dramatically with the method according to the invention. In fact, with this method, proximity effects have been observed only within the range of the electron beam diameter. Accordingly, by using a high performance SEM, the beam diameter will be reduced and the current density will be increased. Finer structure with relatively insignificant proximity effects will then be achievable using an even smaller line dose.

A second important point to note is that no lift-off is required here as in the case of resist based processes. Such lift-off processes can significantly reduce resolution and reduce the yield.

EXAMPLE 3

The details of the method presented in this example will emphasize the particular case of fabrication of masks for X-ray lithography using a platinum silicide. The activation energy to form the first type of platinum silicide ($Pt_2Si$) is around 1.4 eV and the temperature range for a complete transformation of Pt into $Pt_6Si$ is from 200–350° C. [Colgan, E. G, Journal of Material Resistance, 10, 1953, (1995)]. A focused electron beam of a standard scanning electron microscope (SEM) at low energy (1 to 3 keV) provides sufficient energy to locally form this silicide, despite the heat dissipation in the material.

A tantalum layer of 450 nm was evaporated onto a clean X-ray transparent material (glass) using an electron gun deposition system. Using the same deposition system, a 40 nm layer of silicon and a 20 nm layer of platinum are deposited in sequence. The electron beam lithography system consists of a JEOL JSM-6300 scanning electron microscope (SEM) equipped with a tungsten filament and a beam blanker, controlled by the NPGS [Nanometer Pattern Generation System, version 7.6, by J. C. Nabity Lithography Systems] lithography software. Exposures were carried out at 1.4 keV and the unexposed platinum was removed from the silicon surface using a dilute aqua regia solution of $H_2O:HCl:HNO_3=8:7:1$ at 80° C. An etch time of 1 minute was used. In these conditions, the silicide is left intact by the wet etch.

Figure 4:
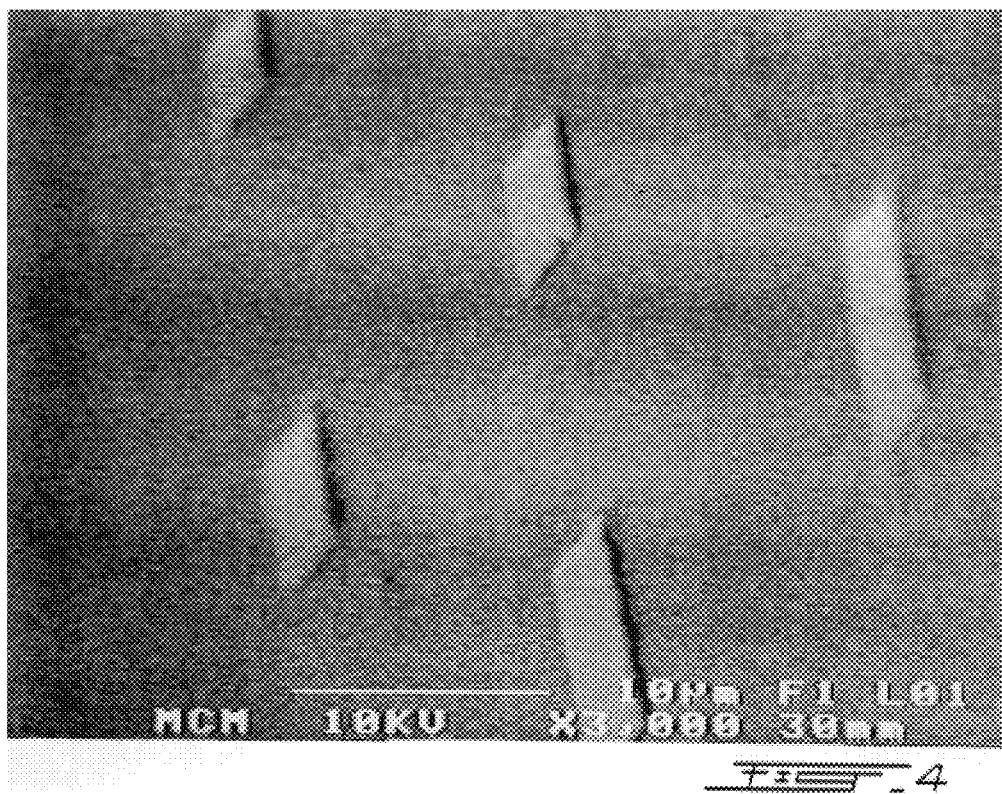
FIG. 4 is a micrograph of tantalum squares covered with platinum silicide on a glass substrate, in which thin layers of metal and silicon were alloyed using a focused electron beam, in which after removal of the platinum layer a halo-carbide plasma was used to etch the silicon and tantalum layers, and in which the platinum silicide squares acted as an etch mask.

A $CF_4:O_2$ plasma is then used to remove the silicon layer and the tantalum layer. Silicide structures act as an etch mass, being unaffected by the plasma etching. Regions underneath the silicide structures are therefore protected and left intact. Although this was performed in our case using a non-directional plasma etch, similar results could be achieved using a directional plasma etching system, such as a reactive ion etcher (RIE). In our case, sidewalls are not perpendicular to the surface, due to the non-directionality of the plasma etch. A reactive ion etching or other non-isotropic etch system could achieve perpendicular sidewalls, therefore a greater resolution. FIG. 4 shows an example of a structure obtained with this method, after the final plasma etching.

With this method, both the resolution and the chemical resistance of the fabricated silicide structures are sufficient to meet the industrial requirements for fabricating masks for X-ray lithography. Platinum silicide has an excellent resistance to many chemical etches, especially to the halocarbide plasmas used to etch the tantalum layer. In this case, tantalum was chosen for its excellent mechanical properties and good chemical resistance, which are needed for the periodical cleaning of masks used in industry. Tantalum also has a high atomic number that makes it a good X-ray absorbent.

EXAMPLE 4

Another example of the method is the fabrication of molds for nanoimprint lithography. These molds need to be resistant to mechanical constraints that are applied to transfer the pattern from the mold to a mechanically impressible surface. The fabrication of molds requires an etch mask which has both high resolution and excellent resistance to the chemicals used to etch the mold substrate. With our technique, a mechanically resistant substrate (such as tantalum or silicon carbide) is covered by a thin layer of silicon, followed by a thin layer of a metal able to form silicide. The electron beam lithography system transfers the pattern by forming silicide regions on the surface. Wet etching in a strong acid is used to remove the thin metal layer in unexposed regions. Similarly, a plasma etch or a wet etch can be used to remove the thin silicon layer in unexposed regions. A reactive ion etcher or any directional etching process can then be used to etch the substrate. Exposed regions of the substrate are covered by silicide and are therefore protected, while grooves are etched elsewhere, thus creating a mold that can be used in nanoimprint lithography.

EXAMPLE 5

A last example of the method is the fabrication of MOS (metal-oxide-semiconductor) structures. A 50 nm silicate ($SiO_2$) layer is deposited using a plasma enhanced chemical vapor deposition system (PECVD) on a clean silicon substrate. 20 nm layers of platinum and silicon are then evaporated using an electron gun deposition system, silicon on top. Lithography is performed using the same SEM and software as in the previous example. The thin silicon layer on top is removed by a $CF_4:O_2$ plasma. Afterward, the platinum layer is removed using a dilute aqua regia solution of $H_2O:HCl:HNO_3=8:7:1$ at 80° C. Both etches do not attack the silicide structures formed by the electron beam. The silicide structures are then used as an etch mask during the $CF_4:O_2$ plasma etch of the quartz layer. The silicate layer is completely removed except for the regions underneath the silicide structures.

In summary, a novel fabrication method to produce sub-50 nm metallic lines for use as thin conducting structures or even as etching masks on a vast variety of substrates has been disclosed. This method should reduce the proximity effects present in resist-based lithography and provide a resolution limit superior to the 50 nm linewidth obtained using a tungsten filament SEM. Also, the method is suitable for the fabrication of masks for X-ray lithography that meet the requirements of industry in terms of material resistance and resolution, and for the fabrication of molds for nanoimprint lithography and for the fabrication of MOS structures.

Although the present invention has been described hereinabove with reference to preferred embodiments thereof, these embodiments can be modified at will, within the scope of the appended claims, without departing from the spirit and nature of the subject invention. As non limitative examples:

- semiconductor materials, other than silicon (Si), such as gallium arsenide (GaAs) could be used;
- with a substrate of silicon (Si), the metal can be selected from the group consisting of: cobalt (Co), chrome (Cr), hafnium (Hf), iridium (Ir), manganese (Mn), nickel (Ni), palladium (Pd), platinum (Pt), rhodium (Rh), tantalum (Ta), titanium (Ti), tungsten (W), zirconium (Zr);
- with a substrate of gallium arsenide (GaAs), at least platinum (Pi) could be used as metal.

What is claimed is:

1. A method for fabricating a structure of etch-resistant metal/semiconductor compound on a substrate of semiconductor material, comprising the steps of:
   depositing onto the substrate a layer of metal capable of reacting with said semiconductor material to form etch-resistant metal/semiconductor compound;
   producing a focused electron beam;
   applying the focused electron beam to the layer of metal to locally heat said metal and semiconductor material and cause diffusion of said metal and semiconductor material in each other to form etch-resistant metal/semiconductor compound;
   displacing the focused electron beam onto the layer of metal to form the structure of etch-resistant metal/semiconductor compound; and
   wet etching the layer of metal to leave on the substrate only the structure of etch-resistant metal/semiconductor compound.

2. A method for fabricating a structure of etch-resistant metal/semiconductor compound on a substrate of semiconductor material as recited in claim 1, in which said semiconductor material is selected from the group consisting of silicon and gallium arsenide.

3. A method for fabricating a structure of etch-resistant metal/semiconductor compound on a substrate of semiconductor material as recited in claim 2, wherein said metal is selected from the group consisting of: cobalt, chrome, hafnium, iridium, manganese, nickel, palladium, platinum, rhodium, tantalum, titanium, tungsten, zirconium.

4. A method for fabricating a structure of etch-resistant metal/semiconductor compound on a substrate of semiconductor material as recited in claim 1, wherein:
   said producing step comprises producing a highly focused electron beam; and
   said displacing step comprises displacing the highly focused electron beam onto the layer of metal to form a sub-micron structure of etch-resistant metal/semiconductor compound.

5. A method for fabricating a structure of etch-resistant metal/semiconductor compound on a substrate of semiconductor material as recited in claim 1, in which said displacing step comprises computer-controlling displacement of the electron beam on the layer of metal to form a patterned structure of etch-resistant metal/semiconductor compound.

6. A method for fabricating a structure of etch-resistant metal/semiconductor compound on a substrate of semiconductor material as recited in claim 1, further comprising, after said step of wet etching the layer of metal, the step of conducting a plasma etch to remove a carbon deposit formed at the surface of the structure of etch-resistant metal/semiconductor compound.

7. A method for fabricating a structure of etch-resistant metal/semiconductor compound on a substrate of semiconductor material as recited in claim 1, further comprising, after said step of wet etching the layer of metal, a step of wet etching the substrate of semiconductor material to remove a thin layer of metal rich semiconductor material formed at the surface of the substrate by reaction, at room temperature, of said metal and semiconductor material with each other.

8. A method for fabricating a structure of etch-resistant metal/semiconductor compound on a substrate of semiconductor material as recited in claim 1, in which said displacing step comprises exposing each portion of the structure of etch-resistant metal/semiconductor compound to the focused electron beam a plurality of times.

9. A method for fabricating a structure of etch-resistant metal/semiconductor compound on a substrate of semiconductor material as recited in claim 1, wherein:
   the structure of etch-resistant metal/semiconductor compound is a suicide structure; and
   the substrate of semiconductor material is a silicon substrate.

10. A method for fabricating a structure of etch-resistant metal/semiconductor compound on a substrate of semiconductor material as recited in claim 9, wherein said metal comprises platinum.

11. A method for fabricating a structure of etch-resistant metal/semiconductor compound on a substrate of semiconductor material as recited in claim 10, wherein said applying step comprises locally heating the platinum and silicon to a temperature situated between 200° C. and 350° C. to form platinum silicide.

12. A method for fabricating a structure of etch-resistant metal/semiconductor compound on a substrate of semiconductor material as recited in claim 10, further comprising the step of growing the platinum silicide by heating said platinum silicide to a temperature situated between 300° C. and 450° C.

13. A method for fabricating a structure of etch-resistant metal/semiconductor compound on a substrate of semiconductor material as recited in claim 10, wherein the layer of platinum has a thickness situated between 20 nm and 100 nm, and the silicon substrate is an n-type high resistivity silicon <100> substrate.

14. A method for fabricating a structure of etch-resistant metal/semiconductor compound on a substrate of semiconductor material as recited in claim 13, wherein said wet etching step is conducted during 4 minutes in a dilute aqua regia solution of $H_2O:HCl:HNO_3=8:7:1$.

15. A method for fabricating a structure of etch-resistant metal/semiconductor compound on a substrate of semiconductor material as recited in claim 10, wherein a thin layer of platinum silicide of about 2 nm thick forms at the surface of the silicon substrate by reaction, at room temperature of the platinum and silicon with each other, and wherein said method further comprises the step of wet etching the silicon substrate during 6 minutes in $H_2O:HNO_3:HF=50:49:1$, to remove said thin layer of platinum silicide.

16. A method for fabricating a structure of etch-resistant metal/semiconductor compound on a substrate of semiconductor material as recited in claim 11, further comprising, after the step of wet etching the layer of platinum, the step of conducting an oxygen plasma etch during 20 minutes to remove a carbon deposit formed at the surface of the silicide structure.

17. A method for fabricating a structure of etch-resistant metal/semiconductor compound on a substrate, comprising the steps of:
   depositing onto the substrate a layer of semiconductor material;
   depositing onto the layer of semiconductor material a layer of metal capable of reacting with said semiconductor material to form etch-resistant metal/semiconductor compound;
   producing a focused electron beam;
   applying the focused electron beam to the layer of metal to locally heat said metal and semiconductor material and cause diffusion of said metal and semiconductor material in each other to form etch-resistant metal/semiconductor compound;
   displacing the focused electron beam onto the layer of metal to form the structure of etch-resistant metal/semiconductor compound;

wet etching the layer of metal to leave on the layer of semiconductor material only the structure of etch-resistant metal/semiconductor compound; and plasma etching the layer of semiconductor material to leave on the substrate only the structure of etch-resistant metal/semiconductor compound.

18. A method for fabricating a structure of etch-resistant metal/semiconductor compound on a substrate as recited in claim 17, in which said semiconductor material is selected from the group consisting of silicon and gallium arsenide.

19. A method for fabricating a structure of etch-resistant metal/semiconductor compound on a substrate as recited in claim 18, in which said metal is selected from the group consisting of cobalt, chrome, hafnium, iridium, manganese, nickel, palladium, platinum, rhodium, tantalum, titanium, tungsten, zirconium.

20. A method for fabricating a structure of etch-resistant metal/semiconductor compound on a substrate as recited in claim 17, in which said substrate comprises at least one layer of deposited material selected from the group consisting of: clean silicon, silicon carbide, tantalum, titanium, tungsten, glass, and quartz, on which the layer of semiconductor material is deposited.

21. A method for fabricating a structure of etch-resistant metal/semiconductor compound on a substrate as recited in claim 17, wherein:

said producing step comprises producing a highly focused electron beam; and said displacing step comprises displacing the highly focused electron beam onto the layer of metal to form a sub-micron structure of etch-resistant metal/semiconductor compound.

22. A method for fabricating a structure of etch-resistant metal/semiconductor compound on a substrate as recited in claim 17, further comprising, after said steps of wet etching the layer of metal and plasma etching the layer of semiconductor material, the step of conducting a plasma etch to remove a carbon deposit formed at the surface of the structure of etch-resistant metal/semiconductor compound.

23. A method for fabricating a structure of etch-resistant metal/semiconductor compound on a substrate as recited in claim 17, in which said displacing step comprises exposing each portion of the structure of etch-resistant metal/semiconductor compound to the focused electron beam a plurality of times.

24. A method for fabricating a structure of etch-resistant metal/semiconductor compound on a substrate as recited in claim 17, wherein said plasma etching step comprises etching the layer of semiconductor material with a halo carbide plasma.

25. A method for fabricating a structure of etch-resistant metal/semiconductor compound on a substrate as recited in claim 17, wherein the structure of etch-resistant metal/semiconductor compound is a a silicide structure, and wherein the layer of semiconductor material is a silicon layer.

26. A method for fabricating a structure of etch-resistant metal/semiconductor compound on a substrate as recited in claim 25, in which said applying step comprises locally heating said metal and silicon to a temperature situated between 200° C. and 700° C.

27. A method for fabricating a structure of etch-resistant metal/semiconductor compound on a substrate as recited in claim 17, in which said producing step comprises producing a focused electron beam having a current density higher than 100 mA/cm$^2$.

28. A method for fabricating a structure of etch-resistant metal/semiconductor compound on a substrate, comprising the steps of:

depositing onto the substrate a layer of metal;

depositing onto the layer of metal a layer of semiconductor material capable of reacting with said metal to form etch-resistant metal/semiconductor compound;

producing a focused electron beam;

applying the focused electron beam to the layer of semiconductor material to locally heat said semiconductor material and said metal and cause diffusion of said meal and semiconductor material in each other to form etch-resistant metal/semiconductor compound;

displacing the focused electron beam onto the layer of semiconductor material to form the structure of etch-resistant metal/semiconductor compound;

plasma etching the semiconductor material to leave on the layer of metal only the structure of etch-resistant metal/semiconductor compound; and wet etching the layer of metal to leave on the substrate only the structure of etch-resistant metal/semiconductor compound.

29. A method for fabricating a structure of etch-resistant metal/semiconductor compound on a substrate as recited in claim 28, in which said semiconductor material is selected from the group consisting of silicon and gallium arsenide.

30. A method for fabricating a structure of etch-resistant metal/semiconductor compound on a substrate as recited in claim 29, in which said metal is selected from the group consisting of: cobalt, chrome, hafnium, iridium, manganese, nickel, palladium, platinum, rhodium, tantalum, titanium, tungsten, and zirconium.

31. A method for fabricating a structure of etch-resistant metal/semiconductor compound on a substrate as recited in claim 28, in which said substrate comprises at least one layer of deposited material selected from the group consisting of; clean silicon, silicon carbide, tantalum, titanium, tungsten, glass, and quartz, on which the layer of metal is deposited.

32. A method for fabricating a structure of etch-resistant metal/semiconductor compound on a substrate as recited in claim 28, wherein:

said producing step comprises producing a highly focused electron beam; and said displacing step comprises displacing the highly focused electron beam onto the layer of semiconductor material to form a sub-micron structure of etch-resistant metal/semiconductor compound.

33. A method for fabricating a structure of etch-resistant metal/semiconductor compound on a substrate as recited in claim 28, further comprising, after said steps of plasma etching the layer of semiconductor material and wet etching the layer of metal, the step of conducting a plasma etch to remove a carbon deposit formed at the surface of the structure of etch-resistant metal/semiconductor compound.

34. A method for fabricating a structure of etch-resistant metal/semiconductor compound on a substrate as recited in claim 28, in which said displacing step comprises exposing each portion of the structure of etch-resistant metal/semiconductor compound to the focused electron beam a plurality of times.

35. A method for fabricating a structure of etch-resistant metal/semiconductor compound on a substrate as recited in claim 28, wherein said plasma etching step comprises etching the layer of semiconductor material with a halo carbide plasma.

36. A method for fabricating a structure of etch-resistant metal/semiconductor compound on a substrate as recited in claim 28, wherein the structure of etch-resistant metal/ semiconductor compound is a a silicide structure, and wherein the layer of semiconductor material is a silicon layer.

37. A method for fabricating a structure of etch-resistant metal/semiconductor compound on a substrate as recited in claim 36, in which said applying step comprises locally heating said metal and silicon to a temperature situated between 200° C. and 700° C.

38. A method for fabricating a structure of etch-resistant metal/semiconductor compound on a substrate as recited in claim 28, in which said producing step comprises producing a focused electron beam having a current density higher than 100 mA/cm$^2$.

\* \* \* \* \*